United States Patent
Delferriere et al.

(10) Patent No.: US 8,835,871 B2
(45) Date of Patent: Sep. 16, 2014

(54) ELECTRON CYCLOTRON RESONANCE ION SOURCE DEVICE

(75) Inventors: Olivier Delferriere, Bruyeres le Chatel (FR); Olivier Tuske, Palaiseau (FR); Francis Harrault, Bagnolet (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/994,251

(22) PCT Filed: Dec. 13, 2011

(86) PCT No.: PCT/FR2011/052961
§ 371 (c)(1),
(2), (4) Date: Aug. 21, 2013

(87) PCT Pub. No.: WO2012/080650
PCT Pub. Date: Jun. 21, 2012

(65) Prior Publication Data
US 2013/0327954 A1 Dec. 12, 2013

(30) Foreign Application Priority Data
Dec. 15, 2010 (FR) ..................... 10 60578

(51) Int. Cl.
*H01J 27/16* (2006.01)
*H01J 27/18* (2006.01)
*H01J 37/32* (2006.01)

(52) U.S. Cl.
CPC .......... *H01J 27/18* (2013.01); *H01J 37/32678* (2013.01)
USPC ................... 250/423 F; 250/423 R; 250/424; 250/427

(58) Field of Classification Search
CPC ................ H01J 37/32192; H01J 37/04; H01J 37/32678; H01J 49/06
USPC ........... 250/396 R, 398, 396 ML, 423 R, 424, 250/426, 427, 423 P, 423 F
See application file for complete search history.

(56) References Cited

FOREIGN PATENT DOCUMENTS

| JP | 06-19961 | 1/1994 |
|----|----------|--------|
| JP | 09-055170 | 2/1997 |

OTHER PUBLICATIONS

Gobin, R., et al., "A 140 mA cw deuteron electron cyclotron resonance source for the IFMIF-EVEDA project," Review of Scientific Instruments, American Institute of Physics, vol. 79, 2008, pp. 02B303-1-02B303-3.

(Continued)

*Primary Examiner* — Jack Berman
*Assistant Examiner* — Hanway Chang
(74) *Attorney, Agent, or Firm* — Pillsbury Winthrop Shaw Pittman LLP

(57) ABSTRACT

An electron cyclotron resonance ion source device includes a plasma chamber configured to contain a plasma; a high-frequency system configured to transmit a high-frequency wave into the chamber; a magnetic field generator configured to generate a magnetic field in the chamber; an accelerating tube including an isolating structure and an extraction system, the magnetic field generator for generating a magnetic field being entirely located downstream of the isolating structure.

12 Claims, 8 Drawing Sheets

(56) References Cited

OTHER PUBLICATIONS

Lagniel, J.-M., et al., "Status and new developments of the high intensity electron cyclotron resonance source light ion continuous wave, and pulsed mode (invited)," Review of Scientific Instruments, American Institute of Physics, vol. 71, No. 2, Feb. 2000, pp. 830-835.

Gobin, R., et al., "Status of the light ion source developments at CEA/Saclay," Review of Scientific Instruments, American Institute of Physics, vol. 75, No. 5, May 2004, pp. 1414-1416.

Delferrière, O., et al., "Electron cyclotron resonance 140mA D+ beam extraction optimization for IFMIF EVEDA accelerator," Review of Scientific Instruments, American Institute of Physics, vol. 79, 2008, pp. 02B723-1-02B723-3.

International Search Report as issued for PCT/FR2011/052961.

ELECTRON CYCLOTRON RESONANCE ION SOURCE DEVICE

CROSS-REFERENCE TO RELATED APPLICATIONS

This is the U.S. National Stage of PCT/FR2011/052961, filed Dec. 13, 2011, which in turn claims priority to French Patent Application No. 1060578, filed Dec. 15, 2010, the entire contents of all applications are incorporated herein by reference in their entireties.

TECHNICAL FIELD

The present invention relates to an electron cyclotron resonance ion source device, and more specifically to a source of monocharged ions of the ECR or "Electron Cyclotron Resonance" type.

PRIOR ART

In a known manner, electron cyclotron resonance devices, also called ECR sources, are used to produce monocharged or multicharged ions (i.e., atoms from which one or more electrons have been removed).

FIGS. 1 to 4 represent an electron cyclotron resonance ion source device for producing beams of monocharged ions from the prior art. Such a device is, for example, described in the following publications:

"Status and new developments of the high intensity electron cyclotron resonance source light ion continuous wave, and pulsed mode," RSI 71 Vol. 2, 830, February 2000

"Status of the light ion source developments at CEA-Saclay," RSI 73 Vol. 5, 1414, May. 2004

"Electron cyclotron resonance 140 mA D+ beam extraction optimization for IFMIF EVEDA accelerator," RSI 79 02B723, 2008.

This device comprises:

a plasma chamber 1 intended to contain plasma;

means for generating a magnetic field 4 in the plasma chamber. These magnetic field 4 generating means may comprise magnets or coils. These magnetic field 4 generating means enable the magnetic field necessary for electron cyclotron resonance to be created in the plasma chamber 1, at the inlet of the plasma chamber. To do this, the magnetic field 4 generating means are generally placed such that they surround the chamber 1;

means 5 for propagating a high-frequency wave into the chamber. These means for propagating a high-frequency wave generally comprise a system for generating a high-frequency wave (not represented) and means 6 for guiding the high-frequency wave to the inlet of chamber 1. The high-frequency wave propagation means are disposed upstream from chamber 1.

In this document, the terms "upstream" and "downstream" are used in reference to the direction of propagation of the ion beam at the outlet of the chamber.

Chamber 1 is supplied with atoms that may come from a gas or a metal and the high-frequency wave propagation means and the magnetic field generation means enable, inside the chamber, a high-frequency wave to be coupled with a magnetic field B, so as to obtain conditions under which electron cyclotron resonance is likely to appear and to ionize the atoms present, thus generating a plasma. To do this, the magnetic field at the inlet of the chamber must present a module $B_{ecr}$ that satisfies condition (1) of electron cyclotron resonance:

$$B_{ecr} = f \cdot 2\pi m/e \qquad (1)$$

In which e represents the charge of the electron, m its mass and f the frequency of the electromagnetic wave.

In order to enable the formation of ions in the chamber, the chamber is at high voltage, i.e., at voltages of up to 100 000 V. The elements that are connected to the chamber are thus also at high voltage. In particular, the magnetic field generating means, at least part of the high-frequency wave propagation means are at high voltage.

The elements at high voltage are supported by an isolation platform 9 and by a support flange 8.

The electron cyclotron resonance ion source device also comprises an accelerating tube 7 that enables electrical isolation between high voltage and low voltage and that enables ions in the chamber to be extracted with a series of electrodes 11 enabling a beam of ions to be formed that is then directed to a low-voltage transport line 10 to be used or studied.

The downstream side of the accelerating tube 7 is connected to the transport line 10, which is at low voltage. The downstream side of the accelerating tube is at low voltage.

Accelerating tube 7 is disposed downstream from the support flange 8, that itself is disposed downstream from the plasma chamber 1. The upstream side of accelerating tube 7 is at high voltage.

Accelerating tube 7 is constituted of two assemblies:

an isolating structure 12 that mechanically maintains the accelerating tube 7 and that also keeps it under vacuum. The isolating structure 12 carries out the electrical interruption between high voltage and low voltage.

a beam extraction system composed of several electrodes 11.

In order to isolate the high-voltage elements from the low-voltage elements, accelerating tube 7 thus comprises an isolating structure 12 that is disposed downstream from support flange 8. The isolating structure 12 presents an upstream end 15 that is at the potential of the support flange 8 and chamber 1, and a downstream end 16 that is at the potential of the transport line 10. To do this, isolating structure 12 is generally an isolating cylindrical structure composed of ceramics 13 and metal rings 14 of potential distribution disposed between the upstream end 15 and the downstream end 16.

Accelerating tube 7 also comprises an extraction system that comprises several electrodes 11a to 11e that form a beam of ions at the outlet of plasma chamber 1. The accelerating tube 7 is connected to an evacuation sleeve 17, downstream from electrodes 11a to 11e, that prevents breakdown between the electrodes.

More specifically, the extraction system comprises a first electrode 11a that is disposed at the outlet of chamber 1. This first perforated electrode 11a produces the outlet opening of the plasma chamber. This first electrode 11a is at high voltage and it is connected to support flange 8.

The extraction system also comprises a second electrode 11b that is connected to one of the potential distribution metal rings 14. This second electrode 11b is at a potential that varies according to the species that one wishes to extract outside the chamber. The potential of the second electrode 11b has independent polarization.

The extraction system then comprises two electrodes 11c and 11d that are connected to the downstream end 16 of accelerating tube 7 and that are at the same potential as the downstream end of accelerating tube 7, i.e., at the potential of the transport line 10.

The extraction system then comprises a fifth electrode 11e disposed between electrodes 11c and 11d that is at a negative potential relative to the potential of the transport line 10 in order to prevent the electrons from returning into plasma chamber 1.

Electrodes 11a to 11e enable the ion beam at the outlet of chamber 1 to be accelerated and guided. The contour of each electrode is optimized to prevent, on the one hand, any electrical breakdown and, on the other hand, any geometric aberration in the focalization of the beam. The region of the space of which the profile of the electrodes determines the beam extraction is inside the zone represented in FIG. 5a, in which the interelectrode distances, thicknesses, angles and radii of each of the electrodes completely characterize the extracted beam. Beyond this critical zone, electrode 11b is connected to one of the potential distribution metal rings 14 in order to be able to polarize the electrode independently. Electrodes 11c and 11d are connected to the downstream flange 16 of accelerating tube 7 in order to bring them to the potential of the transport line 10. Electrode 11e is fixed on electrode 11c thanks to insulating spacers and is brought to a negative potential with relation to transport line 10.

The electrical and mechanical connections of these electrodes 11 must be compatible with the electric field limitation in the accelerating tube, which involves optimization of the shapes of the electrodes and the distances separating them. This results in a structure of overlapping electrodes that is all the more complex as the number of electrodes increases and at a significant quantity of material for their manufacture.

In addition, the isolating structure 12 of the accelerating tube surrounds the electrodes of the extraction system and consequently, it presents a significant diameter and length such that the device from FIGS. 1 and 2 is very bulky.

In addition, the magnetic field generating means 4, that most often comprise coils, are high voltage means such that an isolating transformer must be used to supply the coils with energy, which complicates the design of the device.

In addition, it has been observed that evacuation through the transport line 10 may be insufficient to prevent breakdown between the electrodes.

In addition, the device from FIG. 1 comprises solenoids 30 disposed along the transport line 10 that enable the ion beam to be refocused along the transport line 10. From electrode 11d to the outlet of the accelerating tube 7, the beam diverges by electrostatic repulsion of the beam charges between each other, leading to a considerable beam size and significant divergence of the beam at the outlet of accelerating tube 7. The first solenoid 30 may only be positioned downstream from accelerating tube 7. Refocusing of the beam only takes place at the outlet of the accelerating tube 7, leading to degradation of the brightness of the beam produced.

In addition, the weight of the assembly formed by chamber 1, extraction system 11, magnetic system 4 and isolating chamber 12 makes its support by the single support flange 8 difficult. The support flange 8 that is at high voltage enables the magnetic system as well as the plasma chamber to be supported. Therefore it should rest on a platform 9, isolated from the transport line, which absorbs mechanical forces and ensures centering of the assembly as well as its vacuum tightness. However, the presence of the platform makes the device voluminous and heavy.

DISCLOSURE OF THE INVENTION

The invention aims to remedy the disadvantages from the prior art by proposing an electron cyclotron resonance ion source device that is less bulky than those from the prior art.

Another object of the invention is to propose an electron cyclotron resonance ion source device that is less heavy than those from the prior art.

Another object of the invention is to propose an electron cyclotron resonance ion source device that has a simpler design than those from the prior art.

The invention also aims to propose an electron cyclotron resonance ion source device that has a more effectively focused ion beam.

To do this, an electron cyclotron resonance ion source device is proposed according to a first aspect of the invention, comprising:
- a plasma chamber intended to contain plasma;
- means to generate a magnetic field in the plasma chamber, the plasma chamber being at a first potential, the magnetic field generating means being at a second potential,
- means for propagating a high-frequency wave into the plasma chamber,
- An isolating structure, the isolating structure presenting an upstream end that is at the first potential and a downstream end that is at the second potential, the magnetic field generating means being situated downstream from the isolating structure.

The terms "downstream" and "upstream" are used in reference to an element of the system and with relation to the direction of propagation of the ion beam at the outlet of the plasma chamber.

Unlike devices from the prior art, the magnetic field generating means, which generally comprise at least one coil, are not disposed upstream from the isolating structure, but downstream from the isolating structure. In fact, instead of disposing means to generate a magnetic field around the location where one wishes to create the magnetic field, the invention proposes shifting these generation means downstream from the location where one wishes to create the magnetic field and using the leakage field issued from these magnetic field generating means instead of using the maximum magnetic field produced by the magnetic field generating means.

The act of shifting the magnetic field generating means downstream from the isolating structure frees up the space around the plasma chamber, which simplifies the design of the ion generator device, but also enables the ion beam at the outlet of the chamber to be focused:
- in fact, the magnetic field generating means are downstream from the isolating structure and are at a second potential;
- the relative distance between the upstream side of the plasma chamber and the magnetic field generating means is imposed by obtaining the resonance condition in the plasma chamber,
- the magnetic field generated in the zone situated closest to the magnetic field generating means enables the ion beam that traverses the extraction system to be focused, while the leakage magnetic field produced by the magnetic field generating means enables electron cyclotron resonance to be produced in the plasma chamber.

The magnetic field generating means thus produces both the magnetic field that allows for the electron cyclotron resonance in the plasma chamber and the magnetic field that allows the ion beam in the extraction system to be focused.

The first potential is preferably different from the second potential.

In fact, in devices from the prior art, the plasma chamber and the magnetic field generating means are at the same potential that corresponds to high voltage, which leads to the need to use an isolation platform to support them. In addition, an isolating transformer should be used to supply the magnetic field generating means with energy, which complicates the composition of the device. On the contrary, according to the invention, the magnetic field generating means are no longer at the same potential as the plasma chamber, so that an isolation platform is no longer necessary. In addition, supplying the magnetic field generating means is simplified.

The upstream end of the isolating structure is connected to the parts of the device that are at the first potential, while the parts of the device that are at the second potential are connected to the downstream end of the isolating structure. The isolating structure thus enables the parts of the device that are at the first potential to be electrically isolated from those that are at the second potential.

The device according to the invention may also comprise one or more of the characteristics described below, taken individually or according to all technically possible combinations.

The device is preferably a source of ECR type monocharged ions. This source of monocharged ions is mainly intended for injecting high brightness ion beams in particle accelerators. Direct extraction in the magnetic field limits the radial extension of the beam from its formation in the electrode plasma, and thus limits particle losses on the walls of the transport line vacuum chamber.

According to a preferential embodiment, the magnetic field generating means are entirely situated downstream from the plasma chamber.

According to an embodiment, the device also comprises an extraction system capable of forming an ion beam at the outlet of the plasma chamber.

Advantageously, the extraction system is situated downstream from the plasma chamber.

Advantageously, the extraction system comprises several electrodes.

Advantageously, the chamber presents a downstream side perforated by an outlet opening.

Advantageously, the extraction system comprises a first electrode, disposed along the downstream side of the chamber.

The magnetic field generating means are preferably disposed downstream from the first electrode of the extraction system, such that they enable the beam extracted from the plasma chamber by the first electrode to be focused. The device thus enables a high brightness beam to be produced.

According to an embodiment, at least one part of the high frequency wave propagation means is also at the first potential.

According to an embodiment, the parts of the device that are at the first potential are at high voltage.

In this document, a direct voltage greater than 1000 volts and that may reach several tens of thousands of volts is referred to as high voltage. The ion generating device also preferably comprises an accelerating tube.

Advantageously, the isolating structure is situated upstream from the plasma chamber, which reduces the total length of the device.

In fact, the length of the extraction system may be reduced to a distance on the order of 50 mm regardless of the energy of the extracted beam, by positioning the isolating structure upstream from the plasma chamber.

The isolating structure is preferably disposed around at least one part of the high frequency wave propagation means so as to make the device less bulky.

According to a preferential embodiment, the isolating structure comprises ceramic insulating tubes.

Advantageously, the isolating structure also comprises potential distribution metal rings.

Advantageously, the upstream end of the isolating structure is equipped with a first metal flange.

Advantageously, the downstream end of the isolating structure is equipped with a second metal flange.

According to an embodiment, the device also comprises a support flange that supports the isolating structure.

Advantageously, the support flange also supports the magnetic field generating means.

Advantageously, the support flange also supports the extraction system.

Advantageously, the plasma chamber is connected to the support flange through the isolating structure. Thus, the support flange is electrically isolated from the plasma chamber.

The plasma chamber is preferably disposed between the isolating structure and the support flange.

Advantageously, the support flange is at the same potential as the magnetic field generating means.

The support flange is preferably disposed upstream from the magnetic field generating means.

According to an embodiment, the magnetic field generating means comprise a solenoid, which enables a magnetic field to be created that is sufficiently strong so that electron cyclotron resonance takes place in the plasma chamber.

However, one may also envisage carrying out the invention with magnetic field generating means formed by magnets.

According to different embodiments, the extraction system may comprise one or more of the following electrodes:

a first electrode connected to the plasma chamber; the first electrode is at the first potential, i.e., at the same potential as the plasma chamber;

a second electrode connected to a point in the isolating structure situated between its upstream end and its downstream end; This second electrode may be brought to a potential that varies according to the species to be extracted from the plasma chamber. This second electrode is downstream from the first electrode and it is connected to the isolating structure that is not only upstream from the first electrode, but is also upstream from the plasma chamber; the point of the isolating structure to which this second electrode is connected is chosen according to the potential at which one wishes to place the second electrode;

a third and a fourth electrode connected to the support flange; the third and the fourth electrodes are preferably at the second potential; The act of placing the support flange at the second potential simplifies the design of the third and fourth electrodes since in this way, the third and fourth electrodes may be connected to the support flange instead of being connected to the isolating structure, which makes it possible to have shorter electrodes. In fact, the support flange is preferably situated upstream from the extraction system;

a fifth electrode situated between the third and fourth electrodes, the fifth electrode being at a negative potential with relation to the second potential.

Therefore, instead of having electrode connections towards the downstream of the beam, only the second electrode brought to an intermediate potential between the potential of the transport line and high voltage has to be connected to the isolating structure of the accelerating tube. It is now the only electrode with complex geometry. The geometry of the electrodes is thus considerably simplified.

Advantageously, the device also comprises an evacuation sleeve disposed between the magnetic field generating means and the isolating structure, in order to optimize the operational conditions while lowering the pressure in the extraction system. Thus, the evacuation sleeve is situated nearest the extraction system.

Advantageously, the magnetic field generating means are disposed around the extraction system, reinforcing the focalization of the extracted beam.

BRIEF DESCRIPTION OF THE FIGURES

Other characteristics and advantages of the invention will emerge upon reading the following detailed description, with reference to the attached figures, that illustrate:

FIG. 5b, a simulation of the beam extracted through the electrodes from FIG. 5a;

For more clarity, identical or similar elements are marked by identical reference signs on all of the figures.

DETAILED DESCRIPTION OF AT LEAST ONE EMBODIMENT

Figure 1:
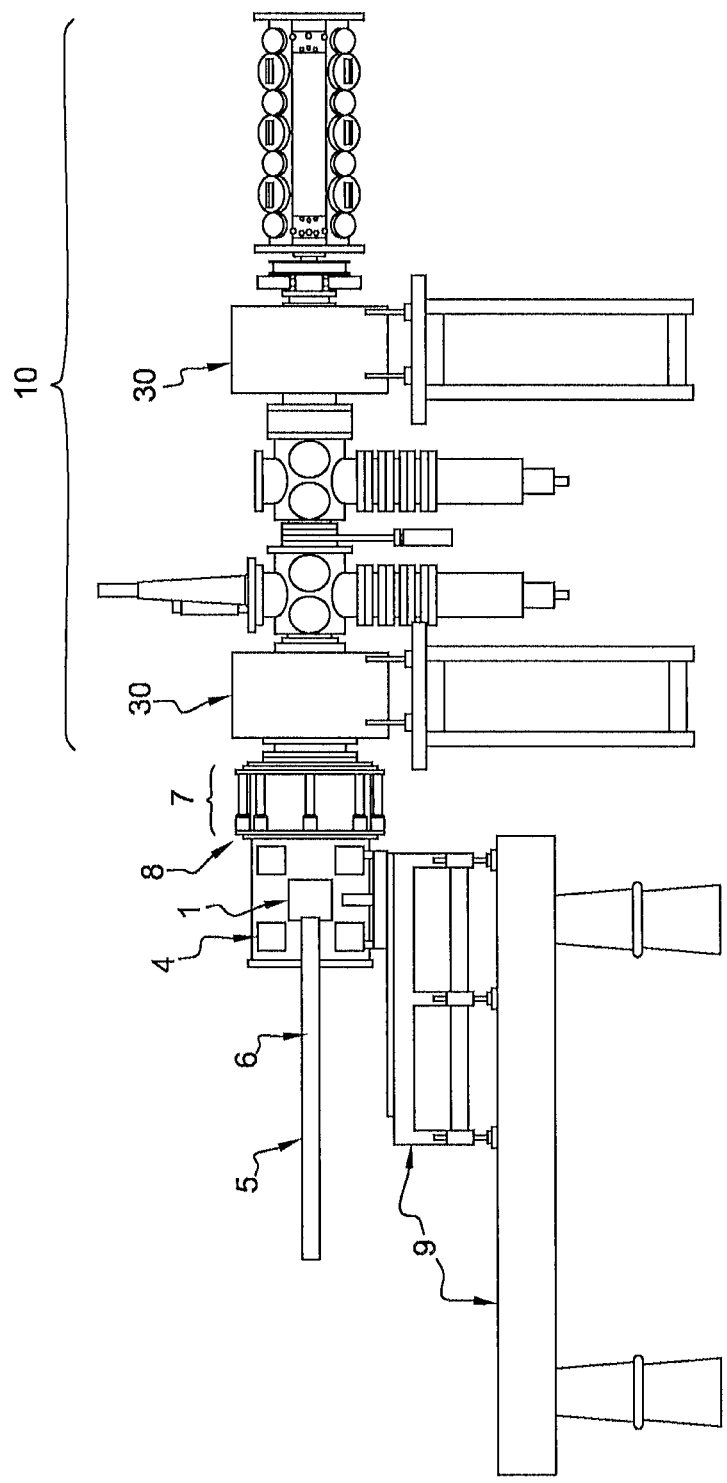
FIG. 1, a side view of an ion generating device from the prior art and the low energy transport line (LEL)
Figure 2:
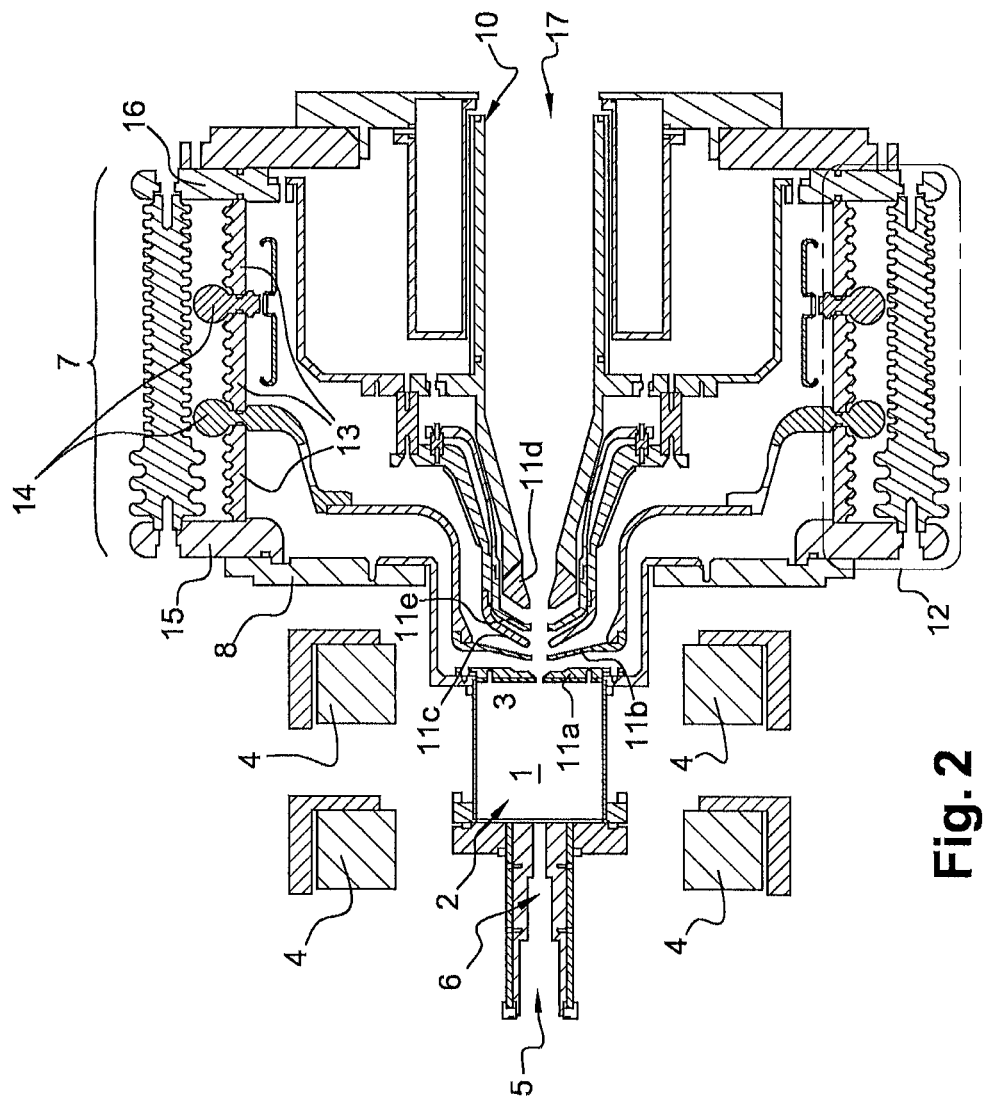
FIG. 2, a cross sectional view of the ion generating device from FIG. 1.
Figure 3:
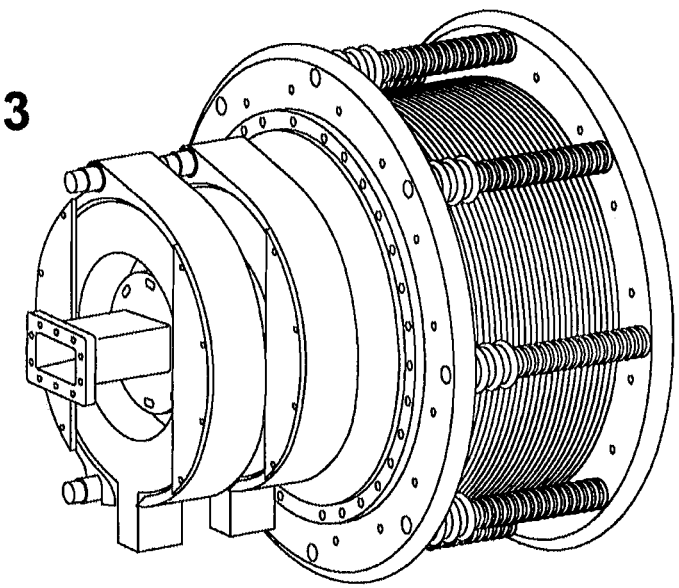
FIG. 3, a perspective view of the exterior of the device from FIG. 1.
Figure 4:
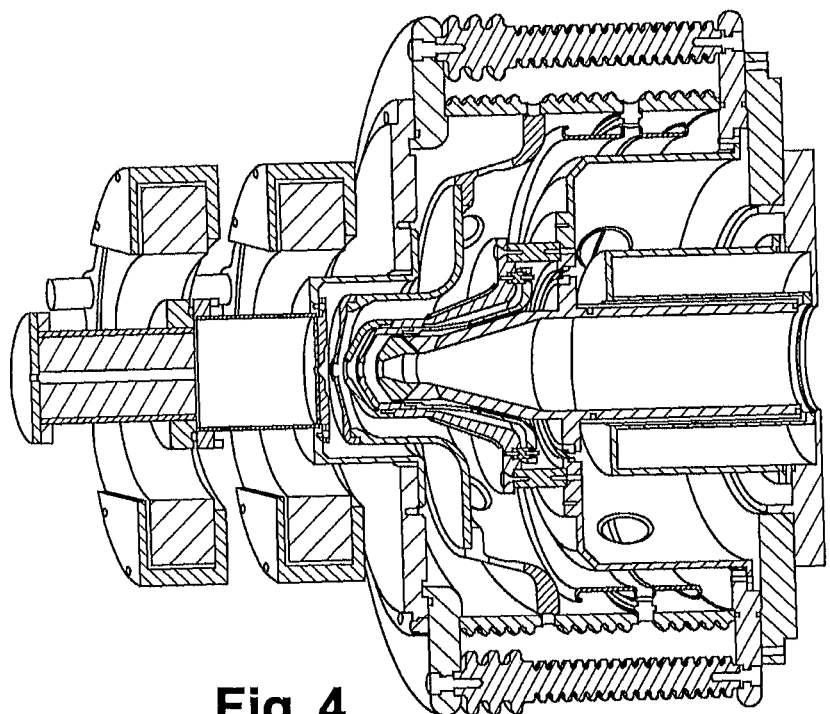
FIG. 4, a perspective view of the interior of the device from FIG. 1.
Figure 5A:
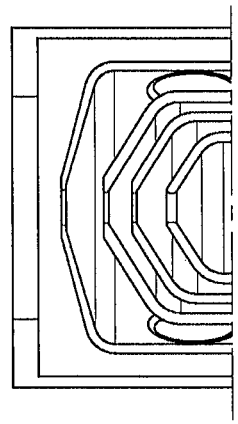
FIG. 5a, an enlarged cross sectional view of the electrodes of the ion generating device from FIG. 2.
Figure 5B:
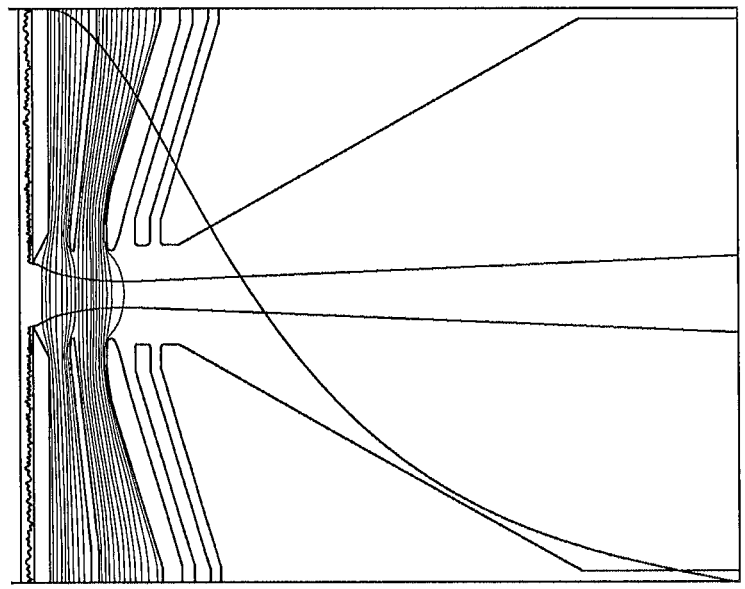
Figure 6:
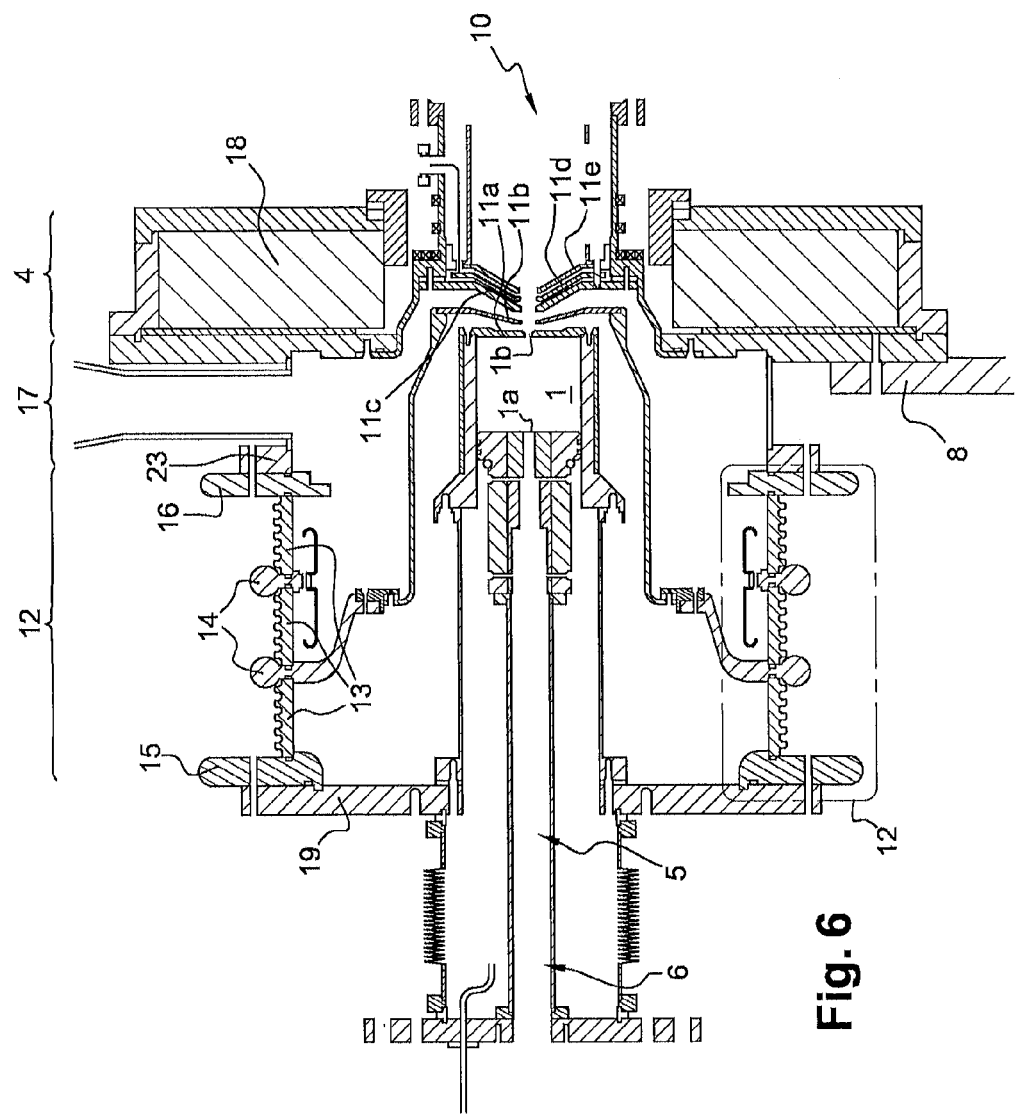
FIG. 6, a cross sectional view of an ion generating device according to an embodiment of the invention.
Figure 7:
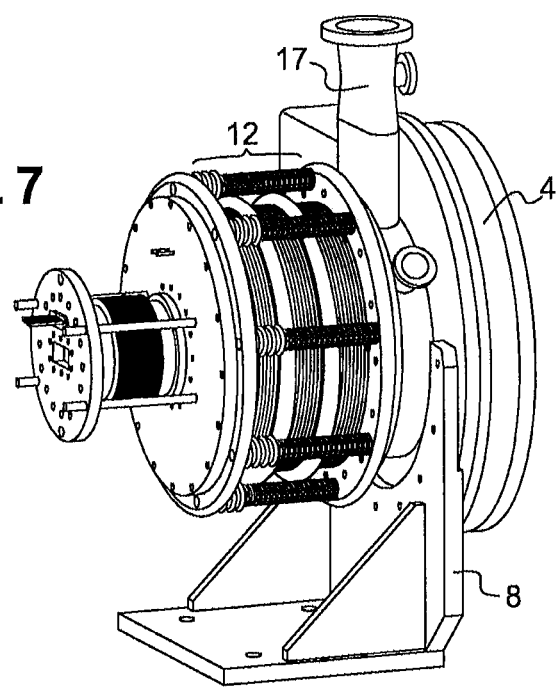
FIG. 7, a perspective view of the device from FIG. 6 seen from the outside.
Figure 8:
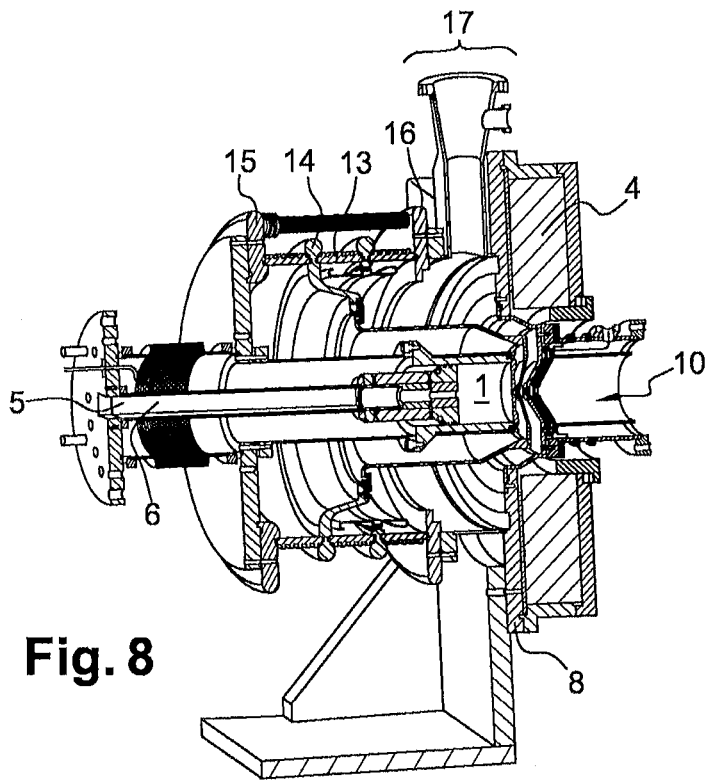
FIG. 8, a perspective view of the interior of the device from FIG. 7.

FIGS. 6 to 8 represent an electron cyclotron resonance ion source device according to an embodiment of the invention.

The electron cyclotron resonance ion source device comprises a plasma chamber 1 capable of containing plasma.

Plasma chamber 1 comprises an upstream side 2 on which is situated an inlet opening 1a of the chamber in which a high frequency wave may be injected, and a downstream side 3 in which is situated an outlet opening 1b by which an ion beam may exit.

The device also comprises means 5 for propagating a high-frequency wave into the chamber. These means 5 for propagating a high-frequency wave preferably comprise a system for generating a high-frequency wave (not represented) and means 6 for guiding the high-frequency wave to the inlet opening 1a of plasma chamber 1. The high-frequency wave propagation means 5 are disposed upstream from plasma chamber 1.

Plasma chamber 1 and at least one part of the high frequency wave propagation means 5 are at a first potential. In the present case, plasma chamber 1 and at least one part of the high frequency wave propagation means 5 are at high voltage, in the present case at a direct voltage on the order of 100 000 V.

The device also comprises an evacuation sleeve 17 that is disposed around the plasma chamber 1. This evacuation sleeve 17 particularly ensures a sufficient vacuum at the level of electrodes 11a to 11e of the extraction system to prevent breakdowns, and to maintain a vacuum on the order of $10^{-3}$ mbar in the plasma chamber 1, enabling formation of the plasma.

The device also comprises a support flange 8 that forms the reinforcement of the device and that supports the entire device. The support flange 8 is at a second potential. The second potential is generally lower than the first potential.

The device also comprises magnetic field generating means 4. These magnetic field generating means 4 preferably comprise a coil 18, however these magnetic field generating means 4 may also comprise one or more magnets. The magnetic field generating means 4 are at the second potential.

The magnetic field generating means 4 are downstream from the plasma chamber 1 and downstream from the support flange 8.

The device also comprises an accelerating tube that comprises an isolating structure 12. The isolating structure 12 comprises an upstream end 15 that is at the first potential and a downstream end 16 that is at the second potential. The upstream end 15 is connected to the first metal flange 19 at the first potential. The downstream end 16 is connected to the upstream flange 23 of the evacuation sleeve 17 at the second potential.

The isolating structure 12 is constituted of ceramic insulating tubes 13 that insulate the elements connected to the upstream end 15 of the isolating structure from those connected to its downstream end 16. The isolating structure also comprises metal rings 14 disposed between the upstream end 15 and the downstream end 16. The metal tubes 14 are at different potentials between the potential of the upstream end 15 and that of the downstream end 16.

The isolating structure 12 is disposed upstream from the plasma chamber 1.

The isolating structure 12 is preferably disposed around at least one part of the high frequency wave propagation means 5, and more specifically around the wave guide 6 of the high frequency wave propagation means 5.

The accelerating tube also comprises an extraction system 11 that enables a beam of ions at the outlet of the plasma chamber 1 to be formed. The extraction system 11 is preferably situated downstream from the plasma chamber 1.

The extraction system 11 preferably comprises several electrodes.

In this embodiment, the extraction system 11 comprises five electrodes 11a to 11e:
- the first electrode 11a is connected to the plasma chamber. More specifically, the first electrode 11a is disposed along the downstream side of the plasma chamber 1. The electrode is perforated and it surrounds the outlet opening 1b of the plasma chamber 1. The first electrode 11a is at the first potential, i.e., at the same potential as the plasma chamber;
- the second electrode 11b is connected to a point on the isolating structure 12 situated between the upstream end 15 and the downstream end 16. This second electrode 11b may be placed at a potential that varies according to the species to be extracted from the plasma chamber. The point of the isolating structure 12 to which this second electrode is connected is chosen according to the potential at which one wishes to place the second electrode. This second electrode 11b is downstream from the first electrode 11a and it is connected to the isolating structure 12;
- a third electrode 11c and a fourth electrode 11d connected to the support flange 8; the third electrode 11c and the fourth electrode 11d are preferably at the second potential;

a fifth electrode 11e situated between the third electrode 11c and the fourth electrode 11d, the fifth electrode 11e being at a negative potential with relation to the second potential.

Figure 9:
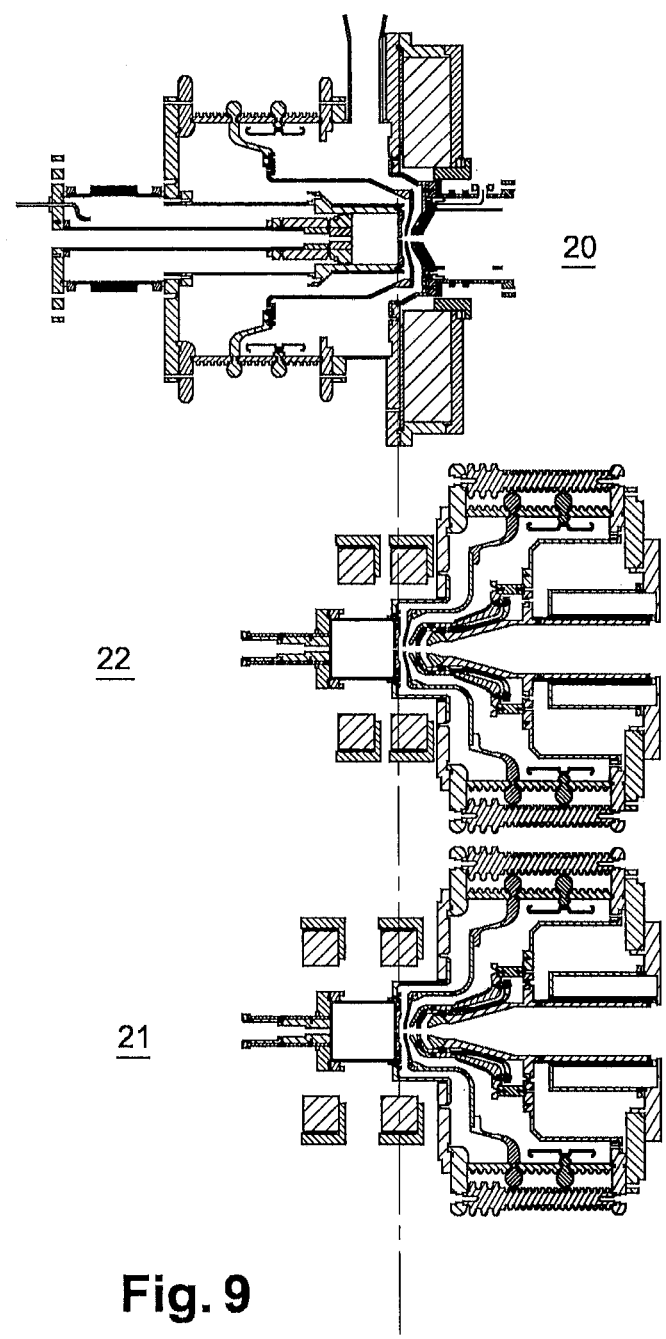
FIG. 9, a comparative cross sectional view between two devices from the prior art and a device according to an embodiment of the invention.

FIG. 9 represents the space occupied by:

a device 20 identical to that described with reference to FIGS. 6 to 8;

a first device 21 from the prior art identical to that described with reference to FIGS. 1 to 4;

a second device 22 from the prior art identical to that from FIGS. 1 to 4 apart from the fact that the magnetic field generating means are slightly shifted towards the support flange.

As may be seen in FIG. 9, the device according to the invention enables the space occupied downstream from the device to be reduced.

Figure 10:
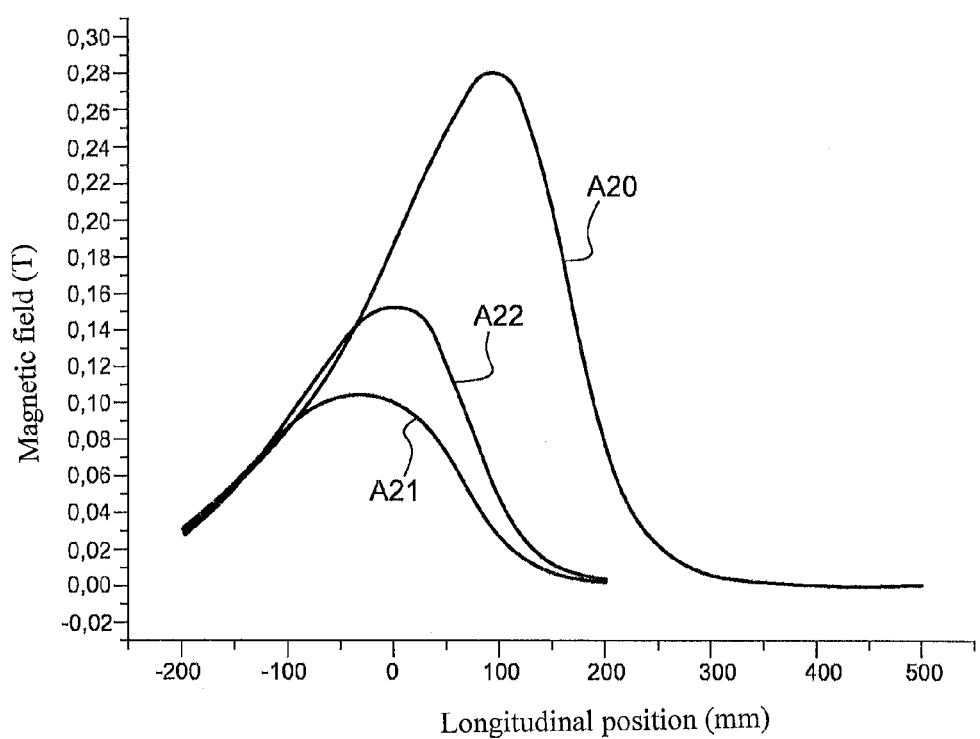
FIG. 10, a curve that represents the magnetic field in the three devices from FIG. 9.

FIG. 10 represents the magnetic field according to the longitudinal position in each of the devices of FIG. 9. More specifically, curve $A_{20}$ represents the evolution of the magnetic field according to the longitudinal position in device 20. Curve $A_{21}$ represents the evolution of the magnetic field according to the longitudinal position in device 21. Curve $A_{22}$ represents the evolution of the magnetic field according to the longitudinal position in device 22. As may be seen in these figures, the magnetic field created downstream from device 20 is stronger than the magnetic fields created downstream from devices 21 and due to the arrangement of magnetic field generating means downstream from device 20 according to the invention and due to the fact that coil 18 used in the device according to the invention presents larger dimensions than devices from the prior art. This stronger magnetic field downstream from the device makes it possible to focus the ion beam at the outlet of the plasma chamber.

Naturally, the invention is not limited to the embodiments described with reference to the figures and variations may be contemplated without departing from the scope of the invention.

The invention claimed is:

1. An electron cyclotron resonance ion source device comprising:
   a plasma chamber configured to contain plasma;
   a magnetic field generator configured to generate a magnetic field in the plasma chamber, the plasma chamber being at a first potential, the magnetic field generator being at a second potential,
   a high-frequency system configured to propagate a high-frequency wave into the plasma chamber,
   an isolating structure including an upstream end that is at the first potential and a downstream end that is at the second potential, the magnetic field generator being arranged downstream from the isolating structure.

2. The device according to claim 1, wherein the isolating structure is disposed around at least one part of the high frequency system.

3. The device according to claim 1, comprising an evacuation sleeve disposed between the magnetic field generator and the isolating structure.

4. The device according to claim 1, comprising an extraction system capable of forming an ion beam at the outlet of the plasma chamber.

5. The device according to claim 4, wherein the extraction system is arranged downstream from the plasma chamber.

6. The device according to claim 1, wherein the plasma chamber includes a downstream side that is perforated by an outlet opening, the extraction system comprising a first electrode disposed along the downstream side of the plasma chamber.

7. The device according to claim 1, wherein at least one part of the high frequency system is at the first potential.

8. The device according to claim 1, comprising a support flange that supports the isolating structure as well as the magnetic field generator.

9. The device according to claim 8, wherein the plasma chamber is arranged between the isolating structure and the support flange.

10. The device according to claim 8, wherein the support flange is at the same potential as the magnetic field generator.

11. The device according to claim 8, wherein the support flange is arranged upstream from the magnetic field generator.

12. The device according to claim 1, wherein the high-frequency system comprises a system configured to generate a high-frequency wave and a guide configured to guide the high-frequency wave.

* * * * *